US009852920B2

(12) United States Patent
Brown et al.

(10) Patent No.: US 9,852,920 B2
(45) Date of Patent: Dec. 26, 2017

(54) ETCH SYSTEM AND METHOD FOR SINGLE SUBSTRATE PROCESSING

(71) Applicant: Tokyo Electron Limited, Tokyo (JP)

(72) Inventors: Ian J. Brown, Austin, TX (US); Wallace P. Printz, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 29 days.

(21) Appl. No.: 15/019,248

(22) Filed: Feb. 9, 2016

(65) Prior Publication Data
US 2016/0155647 A1    Jun. 2, 2016

Related U.S. Application Data

(62) Division of application No. 13/076,396, filed on Mar. 30, 2011, now Pat. No. 9,257,292.

(51) Int. Cl.
  *B44C 1/22*  (2006.01)
  *C03C 15/00*  (2006.01)
  (Continued)

(52) U.S. Cl.
  CPC .. *H01L 21/31111* (2013.01); *H01L 21/30612* (2013.01); *H01L 21/31144* (2013.01); *H01L 21/67086* (2013.01); *B08B 3/00* (2013.01); *B08B 3/024* (2013.01); *B08B 3/04* (2013.01); *B08B 3/08* (2013.01); *B08B 9/08* (2013.01); *B08B 2203/007* (2013.01); *H01L 21/02041* (2013.01); *H01L 21/02052* (2013.01); *H01L 21/02057* (2013.01); *H01L 21/26506* (2013.01); *H01L 21/30604* (2013.01);
  (Continued)

(58) Field of Classification Search
  USPC .......................................... 216/99; 438/757
  See application file for complete search history.

(56) References Cited

U.S. PATENT DOCUMENTS

| 3,709,749 A | 1/1973 | Sato et al. |
| 4,092,211 A | 5/1978 | Morris |

(Continued)

OTHER PUBLICATIONS

Japan Patent Office, Official Action issued in corresponding JP Patent Application No. 2014-502892 mailed Jun. 7, 2016, 10 pp., including English translation.

*Primary Examiner* — Roberts Culbert
(74) *Attorney, Agent, or Firm* — Wood Herron & Evans LLP

(57) ABSTRACT

Provided are a method and system for increasing etch rate and etch selectivity of a masking layer on a substrate in an etch treatment system, the etch treatment system configured for single substrate processing. The method comprises placing the substrate into the etch processing chamber, the substrate containing the masking layer and a layer of silicon or silicon oxide, obtaining a supply of steam water vapor mixture at elevated pressure, obtaining a supply of treatment liquid for selectively etching the masking layer over the silicon or silicon oxide at a selectivity ratio, combining the treatment liquid and the steam water vapor mixture, and injecting the combined treatment liquid and the steam water vapor mixture into the etch processing chamber. The flow of the combined treatment liquid and the steam water vapor mixture is controlled to maintain a target etch rate and a target etch selectivity ratio of the masking layer to the layer of silicon or silicon oxide.

20 Claims, 17 Drawing Sheets

(51) Int. Cl.
*C03C 25/68* (2006.01)
*C23F 1/00* (2006.01)
*C25F 3/00* (2006.01)
*H01L 21/311* (2006.01)
*H01L 21/67* (2006.01)
*H01L 21/02* (2006.01)
*H01L 21/265* (2006.01)
*H01L 21/306* (2006.01)
*B08B 3/04* (2006.01)
*B08B 3/08* (2006.01)
*B08B 3/02* (2006.01)
*B08B 3/00* (2006.01)
*B08B 9/08* (2006.01)

(52) U.S. Cl.
CPC ..... *H01L 21/31133* (2013.01); *H01L 21/6708* (2013.01); *H01L 21/67017* (2013.01); *H01L 21/67051* (2013.01); *H01L 21/67057* (2013.01)

(56) References Cited

U.S. PATENT DOCUMENTS

| | | | |
|---|---|---|---|
| 5,332,145 A | 7/1994 | Bell et al. | |
| 5,786,276 A * | 7/1998 | Brooks | H01L 21/31116 257/E21.252 |
| 5,856,003 A * | 1/1999 | Chiu | H01L 21/8249 257/E21.537 |
| 6,037,273 A | 3/2000 | Gronet et al. | |
| 6,087,373 A | 7/2000 | Coburn et al. | |
| 6,207,068 B1 | 3/2001 | Glick et al. | |
| 6,758,940 B2 | 7/2004 | Chiu | |
| 6,780,277 B2 | 8/2004 | Yokomizo et al. | |
| 6,943,900 B2 | 9/2005 | Niu et al. | |
| 7,591,959 B2 | 9/2009 | Li et al. | |
| 7,601,272 B2 | 10/2009 | Nguyen et al. | |
| 7,694,688 B2 | 4/2010 | Lester et al. | |
| 7,718,084 B2 | 5/2010 | Li et al. | |
| 8,187,487 B2 | 5/2012 | Li et al. | |
| 8,221,642 B2 | 7/2012 | Li et al. | |
| 2004/0060902 A1 | 4/2004 | Evans et al. | |
| 2007/0289732 A1 | 12/2007 | Pillion et al. | |
| 2008/0035609 A1 | 2/2008 | Kashkoush et al. | |
| 2008/0283090 A1 | 11/2008 | DeKraker et al. | |
| 2008/0296664 A1 | 12/2008 | Ramkumar et al. | |
| 2010/0124824 A1 | 5/2010 | Eilmsteiner et al. | |
| 2010/0133605 A1 | 6/2010 | Parikh | |
| 2010/0176082 A1 | 7/2010 | Cooper et al. | |
| 2012/0145672 A1* | 6/2012 | Ratkovich | H01L 21/31111 216/83 |
| 2012/0247505 A1 | 10/2012 | Brown et al. | |
| 2013/0078809 A1* | 3/2013 | Yu | H01L 21/6708 438/689 |

* cited by examiner

ETCH SYSTEM AND METHOD FOR SINGLE SUBSTRATE PROCESSING

CROSS-REFERENCE TO RELATED APPLICATIONS

This application is a divisional of U.S. Pat. No. 9,257,292 issued Feb. 9, 2016 and entitled ETCH SYSTEM AND METHOD FOR SINGLE SUBSTRATE PROCESSING, the disclosure of which is incorporated herein by reference in its entirety as if completely set forth herein below.

FIELD OF THE INVENTION

The present application generally relates to the design of an etch treatment system and method for increasing etch rate and selectivity of etching a masking layer using a single substrate etch process.

BACKGROUND OF THE INVENTION

Current methods in the production of complementary metal oxide semiconductor (CMOS) transistors require masking layers to separate and protect active device regions such as dielectric, metal interconnect, strain, source/drain, and the like. Silicon nitride ($Si_3N_4$) or silicon oxide ($SiO_x$, wherein x is greater than O) is often used as a masking layer due to its electrical and morphological similarity to silicon dioxide ($SiO_2$), as well as because silicon nitride is easily bonded to $SiO_2$. Generally, silicon nitride is used as an etch-stop layer but in certain cases, such as in a "dual damascene" process, the silicon nitride must be etched away without altering the carefully-controlled thickness of the silicon dioxide underlayer. In such instances, the etch selectivity of silicon nitride to silicon oxide, calculated as the etch rate of silicon nitride divided by the etch rate of silicon oxide, ideally is as high as possible to improve the process margin. As devices continue to shrink, the thickness of masking layers and underlayers shrink in tandem. Etch selectivity for ultra-thin layers will become more of a challenge in the future.

Current techniques for selectively etching silicon nitride may use differing chemistries and approaches. Both dry-plasma etching as well as aqueous-chemistry etch are used in the removal of silicon nitride. Aqueous chemistry materials can include dilute hydrofluoric Acid (dHF), hydrofluoric acid/ethylene glycol as well as phosphoric acid. The decision for using the different chemistries is governed by the requirement for silicon nitride etch rate and selectivity to oxide. Aqueous chemistry methods are preferable because of the reduced cost of ownership compared to dry techniques. It is well understood the silicon nitride etch rate in phosphoric acid is strongly influenced by temperature, where the etch rate rises in response to a rise in temperature. In a wet-bench configuration such as immersing substrates into a bath of aqueous phosphoric acid solution, the process temperature is limited by the boiling point of the aqueous phosphoric acid solution. The boiling point of the solution is a function of the concentration of water in aqueous phosphoric acid solution as well as the atmospheric pressure. One current method for maintaining temperature is by a feedback-loop-controller that measures the existence of a boiling state, while adjusting the addition of water volume and heater power timing interval to the bath so as to maintain this boiling state at a target temperature, (typical range of target temperatures is from 140 degrees Centigrade to 160 degrees Centigrade). When the aqueous phosphoric acid solution is heated without addition of water, the boiling point of the aqueous phosphoric acid solution rises as the water is evaporated from the solution.

Increasing the temperature of the phosphoric acid is favorable for increasing the silicon nitride etch rate for production and lower the cost of manufacturing at the expense of lower selectivity because with current phosphoric acid recirculation tanks, the consequence of allowing a high boiling point is to reduce the concentration of water. Water is critical in controlling the selectivity of silicon nitride to silicon oxide or silicon etching. Experimental evidence shows that a non-boiling state (i.e., low water content) at elevated temperature does not result in a favorable etch selectivity.

Conversely, to improve selectivity, it would be preferable to have a high concentration of water, (i.e., dilute the acid further), however this is not practical. Increasing the concentration of water in the bath reduces the boiling point of the acid mixture. At lower temperature, the etch rate of the silicon nitride falls significantly due to the strong Arrhenius relationship of the silicon nitride etch rate with temperature.

In the current art, for example, Morris, in U.S. Pat. No. 4,092,211, discloses a method for controlling within a boiling aqueous phosphoric acid solution the etch rate of a silicon oxide insulator layer which is employed in masking a silicon nitride insulator layer. The method employs the deliberate addition of a silicate material to the boiling aqueous phosphoric acid solution. In addition, Bell et al., in U.S. Pat. No. 5,332,145, disclose a method for continuously monitoring and controlling the compositions of low-solids soldering fluxes that employ a solvent with a specific gravity closely matched to the specific gravity of the flux composition. Desirable in the art are methods and systems that can maintain a high etch rate for a masking layer and also maintain a high selectivity of etching the masking layer over the silicon or silicon oxide. There is a need for batch etch treatment systems and methods and single substrate systems and methods that can meet the goals of etch rate, etch selectivity, etch time, and/or cost of ownership.

SUMMARY OF THE INVENTION

Provided are a method and system for increasing etch rate and etch selectivity of a masking layer on a substrate in an etch treatment system, the etch treatment system configured for single substrate processing. The method comprises placing the substrate into the etch processing chamber, the substrate containing the masking layer and a layer of silicon or silicon oxide, obtaining a supply of steam water vapor mixture at elevated pressure, obtaining a supply of treatment liquid for selectively etching the masking layer over the silicon or silicon oxide at a selectivity ratio, combining the treatment liquid and the steam water vapor mixture, and injecting the combined treatment liquid and the steam water vapor mixture into the etch processing chamber, wherein the flow of the combined treatment liquid and the steam water vapor mixture is controlled to maintain a target etch rate and a target etch selectivity ratio of the masking layer to the layer of silicon or silicon oxide.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

In order to facilitate the description of the present invention, a semiconductor substrate is utilized to illustrate an application of the concept. The methods and processes equally apply to other workpieces such as a wafer, disk, or the like. Similarly, aqueous phosphoric acid is utilized to illustrate a treatment liquid in the present invention. As mentioned below, other treatment liquids can alternatively be used.

Figure 1:
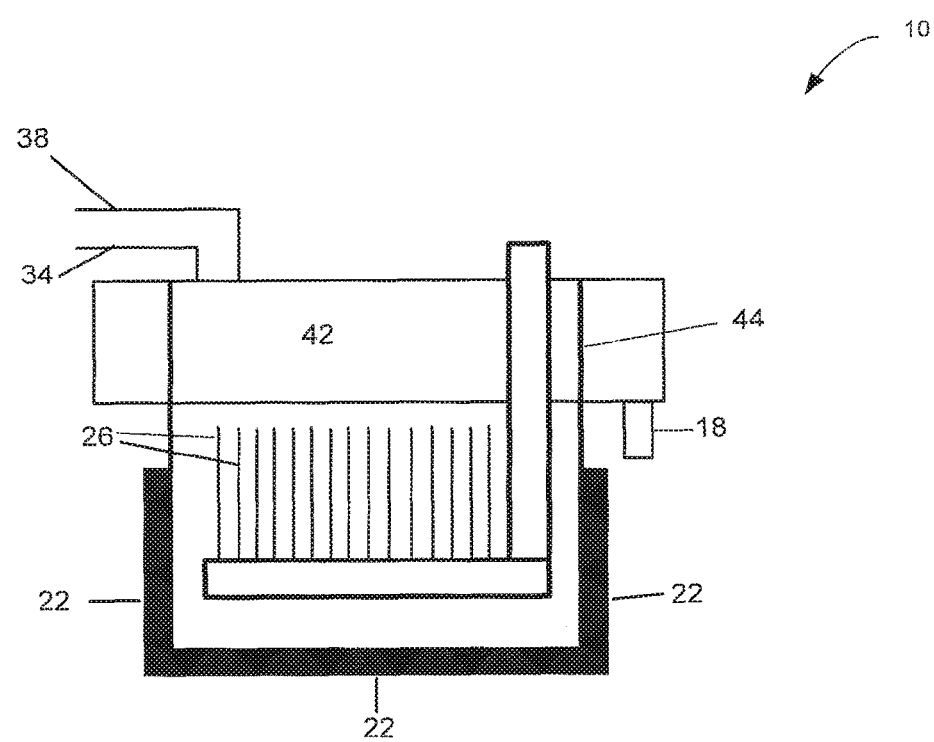
FIG. 1 is an architectural diagram illustrating prior art method of etching silicon nitride in a batch etch process.

Referring to FIG. 1, an architectural diagram 10 illustrates prior art method of etching silicon nitride in a batch etch treatment system where the etch chemicals (etchants) are dispensed using one or more input streams, 34 and 38, onto the etch processing chamber 44 where a plurality of substrates 26 are positioned. The etchants may be reused or recycled or disposed of using the overflow tank 42 and overflow spout 18. Heaters 22 can be provided for example by having heaters on the sides or at the bottom of the process chamber 44. The heaters 22 may be external or inline.

Figure 2:
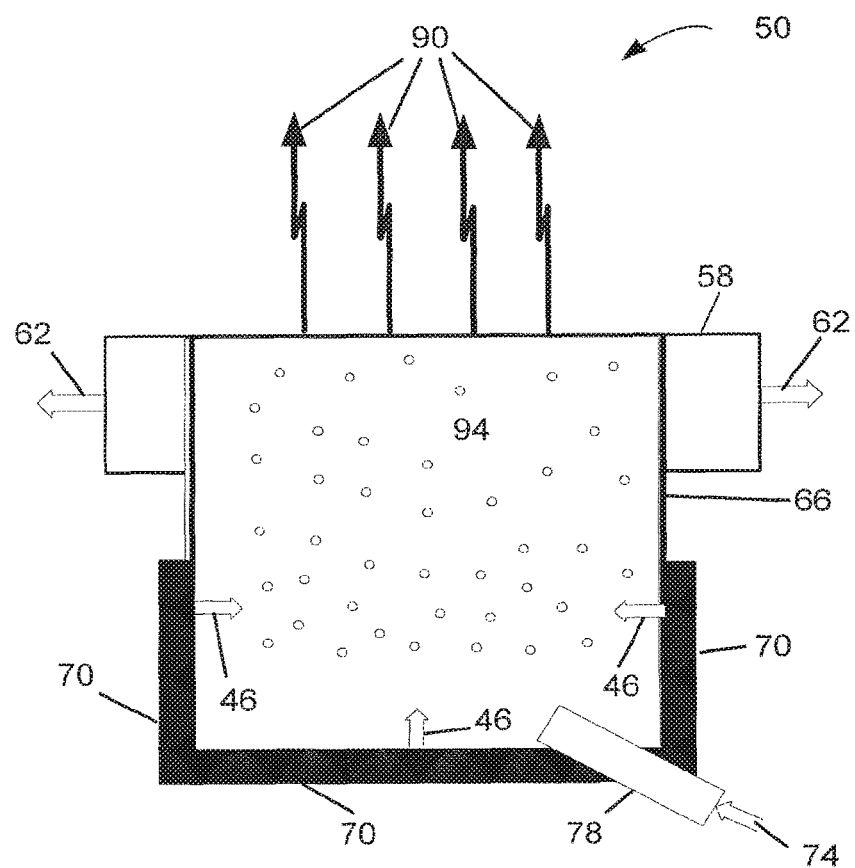
FIG. 2 depicts an exemplary architectural diagram illustrating a prior art batch etch treatment system using a water supply and heaters for etching silicon nitride.

FIG. 2 depicts an exemplary architectural diagram illustrating a prior art batch etch treatment system 50 for etching silicon nitride comprising etch processing chamber 66 and spill tank 58. As above, heaters 70 may be provided in the front, back, and below etch processing chamber 66; these heaters 70 may be external or inline, and may provide the heat flux in 46 into an aqueous solution 94 in the process chamber 66. The heat flux out comprises conduction 62 and evaporation of the water 90. If the heat flux in is greater than the heat flux out due to evaporation and conduction, the temperature of the aqueous solution will increase until boiling occurs. The boiling point is fixed by the acid concentration and atmospheric pressure. During boiling, an increase in heat boils the water away faster. To maintain a constant boiling temperature for the aqueous solution 94, the process chamber controller (not shown) must regulate the heaters 70 and water supply 74 injected through supply line 78 at the same time. If the water supply in is greater than the water loss due to evaporation, the temperature of the aqueous solution decreases, diluting the acid and lowering the boiling point. Conversely, if the water supply in is less than the water loss due to evaporation, the temperature of the aqueous solution increases, concentrating the acid and raising the boiling point.

It is well understood that the silicon nitride etch rate in phosphoric acid is strongly influenced by temperature, wherein the etch rate rises in response to a rise in temperature. The chemical reactions for etching silicon nitride and for etching silicon dioxide are as follows:

$$Si_3N_4 + 4H_3PO_4 + 12H_2O \to 3Si(OH)_4 + 4NH_4H_2PO_4 \qquad (1)$$

$$SiO_2 + 2H_2O \to Si(OH)_4 \qquad (2)$$

In a wet-bench configuration when immersing substrates into a bath of aqueous phosphoric acid solution (aqueous solution), such as in the Tokyo Electron Limited (TEL) EXPEDIUS line of tools, the process temperature is limited by the boiling point of the aqueous solution. The boiling point of the aqueous solution is a function of the concentration of water in acid as well as the atmospheric pressure, and can be described by the Clausius-Clapeyron relation and Raoult's law. The Clausius-Clapeyron equation for the liquid-vapor boundary can be expressed as:

$$\ln\left(\frac{P_1}{P_2}\right) \frac{\Delta H_{vap}}{R}\left(\frac{1}{T_1} - \frac{1}{T_2}\right), \qquad \text{Equation 3.0}$$

wherein
ln is natural logarithm, $T_1$ and $P_1$ are a corresponding temperature (in Kelvins or other absolute temperature units) and vapor pressure, $T_2$ and $P_2$ are the corresponding temperature and pressure at another point, $\Delta H_{vap}$ is the molar enthalpy of vaporization, and R is the gas constant (8.314 J mol$^{-1}$K$^{-1}$).

Raoult's law states the vapor pressure of an ideal solution is dependent on the vapor pressure of each chemical component and the mole fraction of the component present in the solution. Once the components in the solution have reached equilibrium, the total vapor pressure p of the solution is:

$$p = p_A * x_A + p_B * x_B + \ldots \quad \text{Equation 4.0}$$

and the individual vapor pressure for each component is Pi=Pi*r−i where:

p; is the partial pressure of the component i in mixture p*; is the vapor pressure of the pure component i, and $x_i$ is the mole fraction of the component i in solution (in mixture).

Figure 5A:
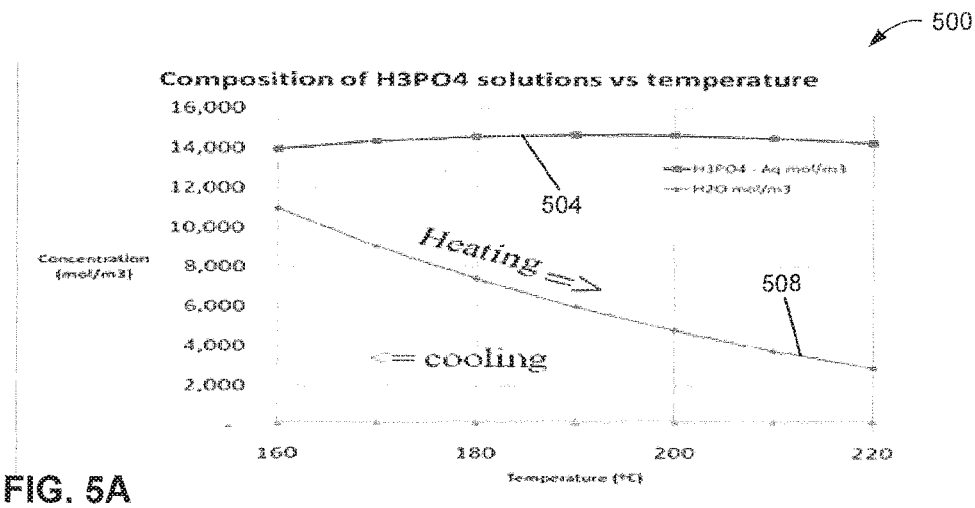
FIG. 5A depicts an exemplary graph of the composition of phosphoric acid solutions as a function of temperature.

An example of equilibrium states for phosphoric acid and water is provided in FIG. 5A. The current TEL EXPEDIUS method for maintaining temperature is by a feedback-loop-controller that measures the existence of a boiling state, while adjusting the addition of water volume and heater power timing interval to the bath so as to maintain this boiling state at a target temperature (160 degrees C.). When the aqueous solution is heated without addition of water the boiling point of the aqueous solution rises as the water is evaporated from the solution.

Figure 5B:
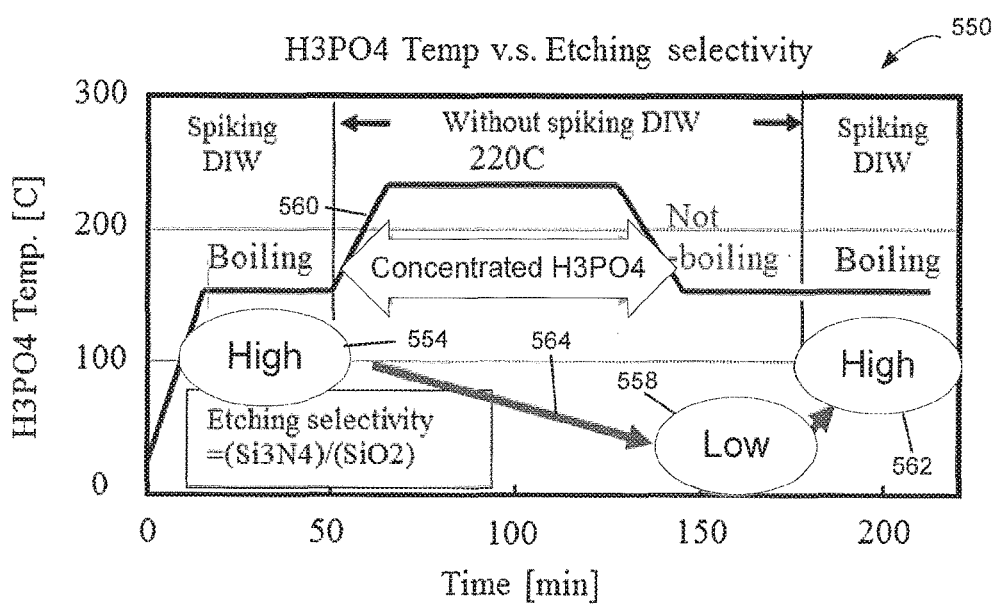
FIG. 5B depicts an exemplary graph of etch selectivity of phosphoric acid.

Increasing the temperature of the phosphoric acid is favorable for increasing the silicon nitride etch rate for production and lower cost of manufacturing at the expense of lower selectivity because with current phosphoric acid recirculation tanks, the consequence of allowing a high boiling point is to reduce the concentration of water. Water is critical in controlling the selectivity of silicon nitride to SiO$_2$ etching [Chemical Reactions in Equations 1, 2]. Experimental evidence shows that a non-boiling state (i.e., low water content) at elevated temperature does not result in a favorable etch selectivity as shown in FIG. 5B. Conversely, to improve selectivity, it would be preferable to have a high concentration of water (i.e., dilute the acid further); however, this is not practical. Increasing the concentration of water in the bath reduces the boiling point of the aqueous solution. At lower temperature, the etch rate of the silicon nitride falls significantly due to the strong Arrhenius relationship of the silicon nitride etch rate with temperature.

The term treatment liquid shall be used for the rest of the specification in order to highlight that a solvent used can be water or some other solvent. The present invention is focused on a novel method for increasing the delivery temperature of the treatment liquid to the silicon nitride to increase the silicon nitride etch rate while also maintaining high water content to maintain optimum silicon nitride etch selectivity over silicon or silicon dioxide. The high temperature is achieved by pressurized steam injection into a stream of phosphoric acid before being dispensed on a stationary or rotating single substrate. Condensation of the steam liberates the latent heat energy into the phosphoric acid providing an efficient transfer to heat the phosphoric acid. An additional benefit is that the phosphoric acid is automatically always saturated with water. Water is necessary to maintain a high silicon nitride etch selectivity over silicon dioxide. For a single pass process, it is necessary to have phosphoric acid supplied with dissolved silica to assist with selectivity control. For a recycle process, silica can be supplied in the native phosphoric acid or by cycling of blanket silicon nitride substrates through the etch treatment system (this is a common process used in batch etch treatment systems, also known as phosphoric acid baths). In an embodiment, a steam jet may also be utilized to preheat the substrate to ensure etch uniformity from center to edge on the substrate.

The problem solved by this invention, among others, is the improvement of the silicon nitride etch rate process using a treatment liquid, for example, phosphoric acid, to enable a single substrate process to be practical and cost effective. Phosphoric acid processing is typically seen as a "dirty process" and is typically followed by a standard clean 1 (SC1) step to remove particles that remain. Single substrate etch processes are inherently cleaner than batch etch processes because the mechanism of defect/particle redeposition and/or backside to frontside contamination can be avoided. Silicon nitride etch processes are slow (30-60 Angstrom/min, or A/min) in hot phosphoric acid at 160 degrees C. If the etch rate of silicon nitride can be increased to over 180 A/min, it would make silicon nitride processing on single substrate process tools feasible. With the use of direct steam injection to heat the silicon nitride, high process temperatures can be achieved while maintaining the saturated water content required for high silicon nitride etch selectivity over silicon or silicon dioxide.

In one embodiment, a boiling apparatus, fed liquid water at ambient temperature, is used to generate a supply of steam water vapor mixture at elevated pressure. The temperature of the steam water vapor mixture can be controlled by the resulting pressure inside the boiler. The steam water vapor mixture is then piped into the chemical delivery line of the hot phosphoric acid to the single substrate processing chamber. The steam water vapor mixture will provide a source of heat and moisture to the bath, thus elevating the bath above standard boiling temperature and introducing an excess of water vapor in both the vapor and liquid phase to maintain nitride etch selectivity over silicon dioxide and silicon.

Sufficient pressure must be maintained to avoid boiling in the supply delivery line. The treatment liquid will then commence rapid boiling upon entering the etch processing chamber at ambient pressure. In another embodiment, multiple nozzles can be used above the substrate. The first nozzle introduces the heated phosphoric acid, the second or more nozzle(s) introduces jets of high temperature steam water vapor mixture to preheat the substrate surface prior to introduction of the phosphoric acid to help with maintaining uniform temperature across the substrate and consequently ensuring etch uniformity. In this embodiment, the nozzle position and number of nozzles can be positioned to maximize the efficiency of heat delivery and treatment liquid to the substrate. The steam water vapor mixture can also be injected onto the backside of the substrate to maintain temperature uniformity.

Figure 3:
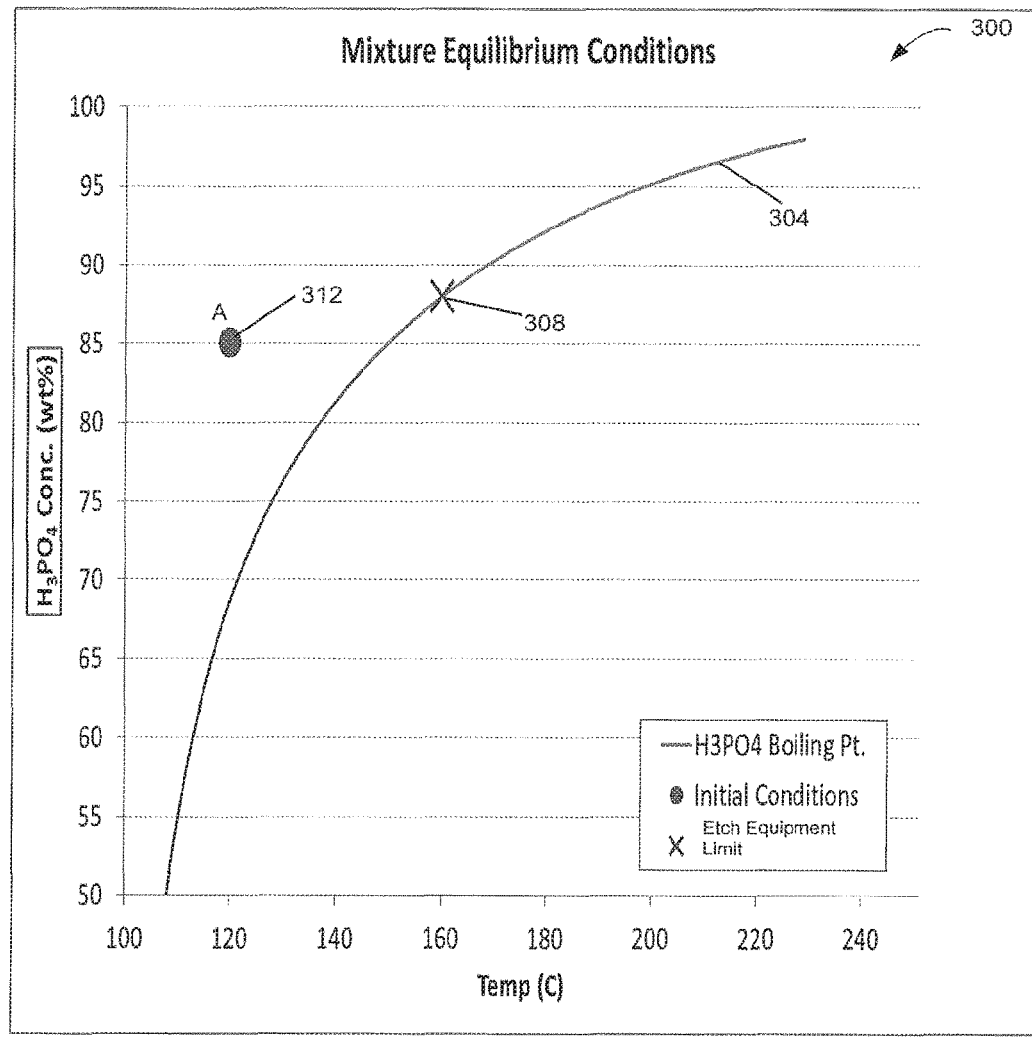
FIG. 3 depicts an exemplary graph of the boiling point of phosphoric acid as a function of phosphoric acid concentration and temperature.

FIG. 3 depicts an exemplary graph 300 of the boiling point of phosphoric acid as a function of phosphoric acid concentration and temperature at one atmosphere pressure. The temperature and concentration of the treatment liquid are two key factors that determine the etch rate and silicon nitride etch selectivity over the silicon or silicon oxide. FIG. 3 depicts a boiling point curve 304 of the temperature of a batch etch process for silicon nitride versus the concentration of the phosphoric acid. Referring to the boiling point curve 304, assuming the treatment liquid is at an initial set of conditions A, for example, the treatment liquid has a phosphoric acid concentration of 85 percent by weight at about 120 degrees Centigrade. The treatment liquid is heated until a boiling point is reached as represented by the point X, labeled 308, which is a point in the boiling point curve 304 that also represents the control limit of an exemplary etch treatment system. As mentioned above, the temperature of the treatment liquid is increased in order to increase the etch rate while maintaining a target silicon nitride etch selectivity and maintaining etch uniformity at the same time.

Figure 4A:
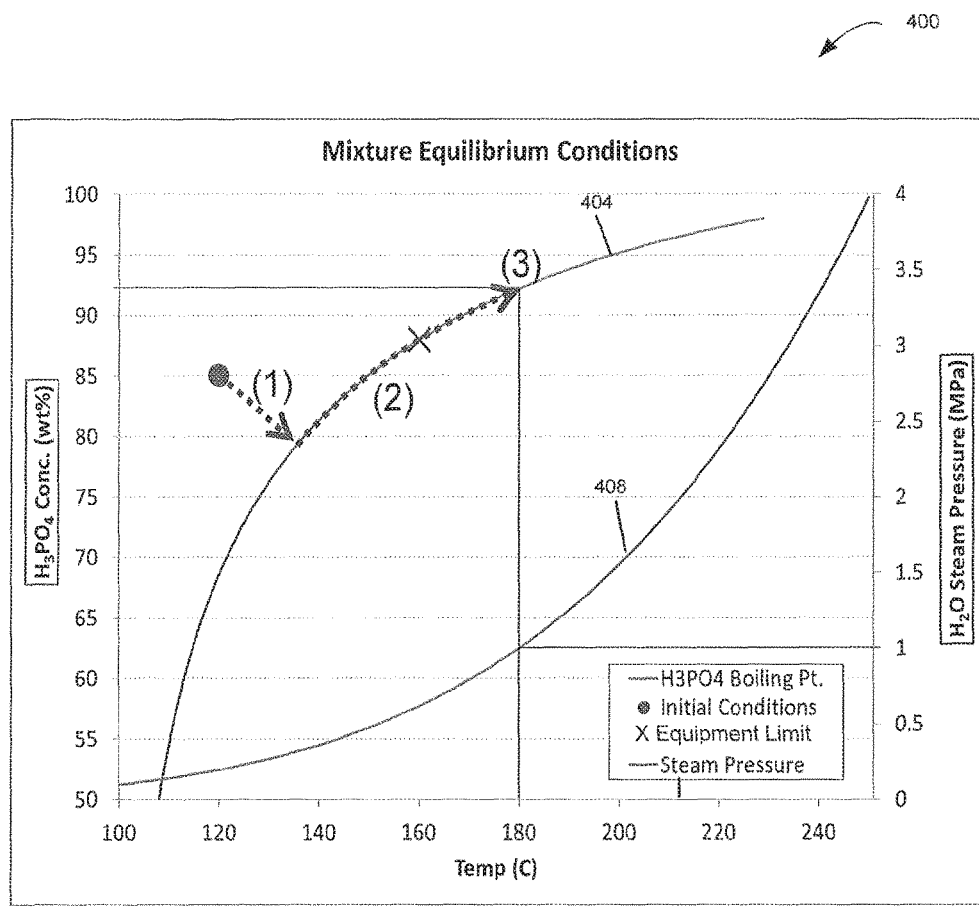
FIG. 4A is an exemplary graph of the boiling point of phosphoric acid as a function of phosphoric acid concentration and temperature and an exemplary graph of steam pressure as a function of temperature for mixture equilibrium conditions in an etch treatment system.

FIG. 4A is an exemplary graph 400 comprising the boiling point curve 404, represented on the left vertical axis, of phosphoric acid as a function of phosphoric acid concentration at one atmosphere pressure and a steam pressure curve 408, represented on the right vertical axis, as a function of temperature for mixture equilibrium conditions in an etch treatment system. The phosphoric acid concentration is expressed as the percent weight of phosphoric acid in the aqueous solution. Assume a set of initial conditions of the treatment liquid at point (1) represented by a dot, corresponding to a composition of 85% phosphoric acid by weight and a temperature of 120 degrees Centigrade (C). The treatment liquid is heated up and reaches boiling temperature represented by the dotted line portion of the boiling point curve 404. Heating may utilize inline or external heaters or by injecting steam water vapor mixture onto the etch treatment liquid. In one embodiment, the etch treatment system has a limit high temperature represented as point (2) on boiling point curve 404 with a corresponding temperature of 160 degrees C. A combination of steam and water vapor (steam water vapor mixture) is pumped into the bottom of the etch treatment system until the treatment liquid reaches a point (3) corresponding substantially to a composition of 92% phosphoric acid by weight, a temperature of 180 degrees C. and a steam pressure at approximately 1.0 mega Pascals (MPa). Other combinations of steam water vapor mixtures with aqueous phosphoric acid can be tested to determine the etch rate and etch selectivity of silicon nitride that meet the objectives of an application. Pressure for the steam water vapor mixture can be in the range from 0.2 to 2.0 MPa.

Figure 4B:
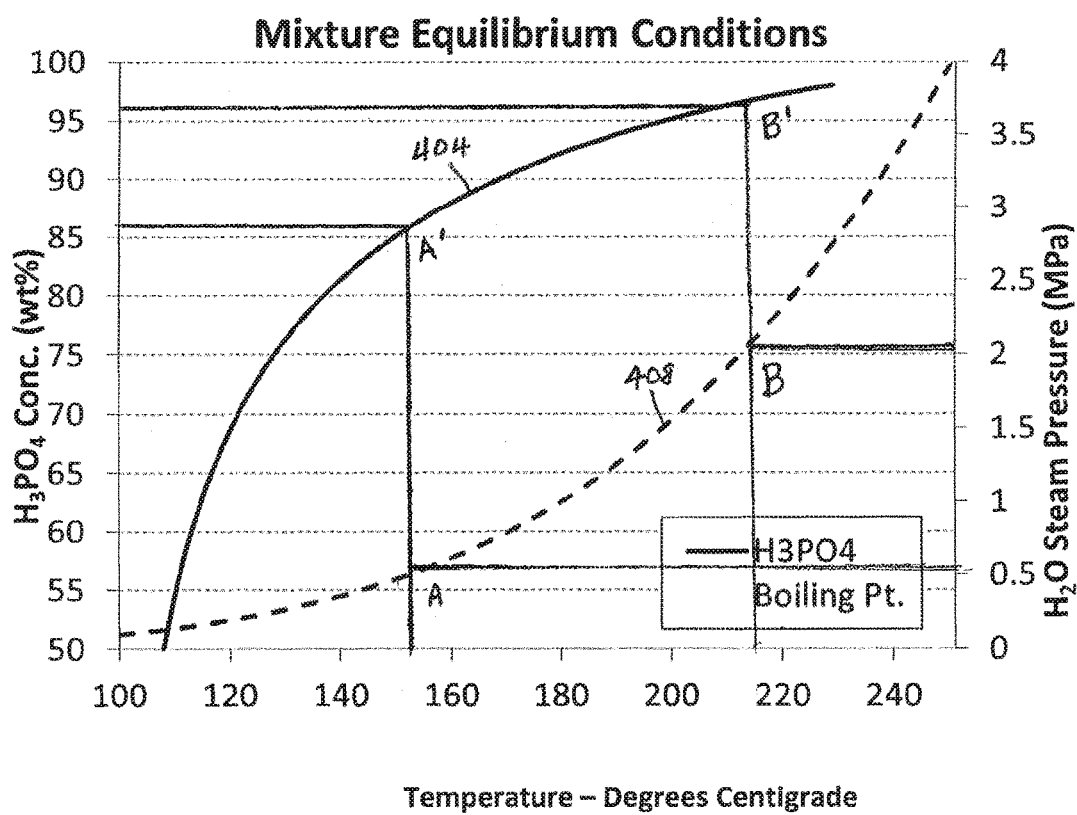
FIG. 4B is an exemplary graph of the boiling point of phosphoric acid as a function of phosphoric acid concentration and temperature and an exemplary graph of steam pressure as a function of temperature for mixture equilibrium conditions at two steam pressures in an etch treatment system.

Referring to FIG. 4B, assume a pressure of 0.5 MPa is selected as the target pressure for steam water vapor mixture. The corresponding temperature of the mixture (point A on the steam pressure curve 408) is about 152 degrees C. As the steam water vapor mixture is injected onto the treatment liquid in a bath or a single substrate etch treatment system, the boiling point is determined by the vertical line connecting point A to point A' of the boiling point curve 404, resulting in a corresponding phosphoric acid concentration at equilibrium of about 86%. If the selected target pressure is 2.0 MPa, the corresponding temperature of the mixture (point B on the steam pressure curve 408) is about 214 degrees C. Using the same approach, the boiling point is determined by the vertical line connecting point B to point B' of the boiling point curve 404, resulting in a corresponding phosphoric acid concentration at equilibrium of about 96%. Thus, a flow rate and pressure of the steam water vapor mixture can be used as variables for controlling a temperature of the treatment liquid, which affects the boiling point temperature of the treatment liquid, and further resulting in a concentration of phosphoric acid in the treatment liquid. The equilibrium phosphoric acid concentration and temperature of the treatment liquid affects the etch rate and etch selectivity.

FIG. 5A depicts an exemplary graph 500 comprising a first curve 504 of the composition of phosphoric acid solutions expressed as aqueous moles per cubic meter (Aq. mols/m3) and a second curve 508 for water expressed as mols/m3) as a function of temperature in degrees C. As the treatment liquid is heated up in the range of 160 to 220 degrees C., the concentration of phosphoric acid is basically flat, whereas the water concentration goes down due to evaporation as the temperature goes up. To further illustrate the changes to etch selectivity of the treatment liquid, FIG. 5B depicts an exemplary graph 550 of etch selectivity of phosphoric acid solutions as a function of time and temperature of the treatment liquid in an etch treatment system. At the beginning of the test, the treatment liquid, (aqueous phosphoric acid) was boiling, and deionized water (DIW) was used to spike the treatment liquid, etch selectivity of silicon nitride to silicon dioxide 554 was high. After 50 minutes, spiking with DIW was stopped and the temperature of the treatment liquid crested at about 220 degrees C., leveled at roughly the same temperature before going lower after heater power was reduced. The etch selectivity also went down from high to low, 554 to 558, as can be seen with the downward slope of etch selectivity curve 564. After resuming the spiking of the treatment liquid with DIW, the treatment liquid went into a boiling state and the etch selectivity went from low to high, 558 to 562. The inventors found that the treatment liquid can be advantageous at a range of 160 to 200 degrees C. and preferably about 180 degrees C. for a treatment liquid using aqueous phosphoric acid.

Figure 6A:
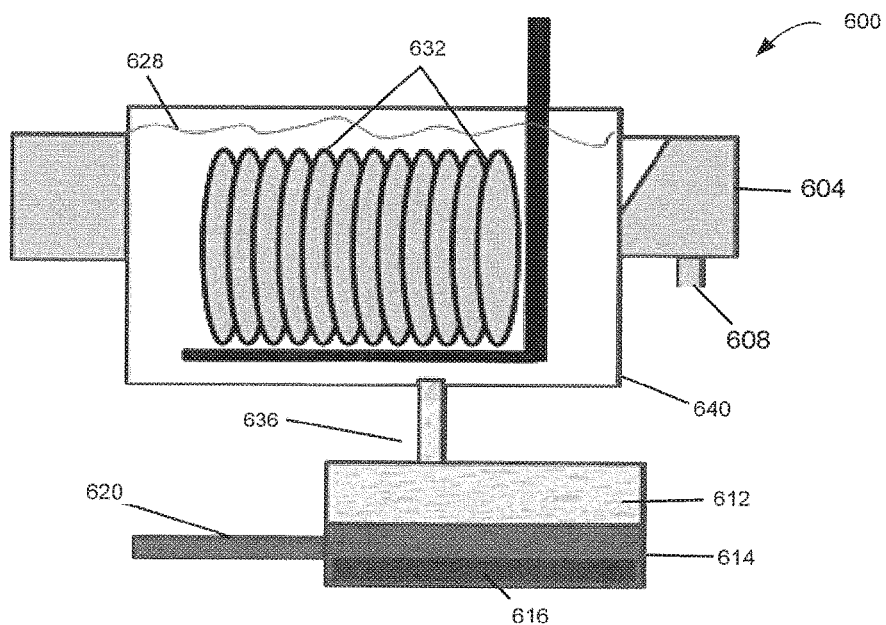
FIG. 6A depicts an exemplary schematic representation of batch etch treatment system according to an embodiment of the present invention.

FIG. 6A depicts an exemplary schematic representation of batch etch treatment system 600 according to an embodiment of the present invention. A plurality of substrates 632 are positioned in an etch processing chamber 640. A treatment liquid 628 is introduced into the etch processing chamber 640 and excess treatment liquid goes into an overflow container 604 and can be disposed via a discharge spout 608. A steam generator 614 is supplied with input liquid via delivery line 620 and is heated by heater 616 which produces a steam water vapor mixture 612. The steam water vapor mixture 612 is dispensed by a connection 636 onto the bottom of the etch processing chamber 640. Using a controller (not shown), the batch etch treatment system 600 is configured to meet a selected etch process rate and a selected etch selectivity ratio by controlling flow rates of the treatment liquid 628 and the steam water vapor mixture 612, which may or may not be pressurized to high pressure. Pressure for the steam water vapor mixture can be in the range from 0.2 to 2.0 MPa.

Figure 6B:
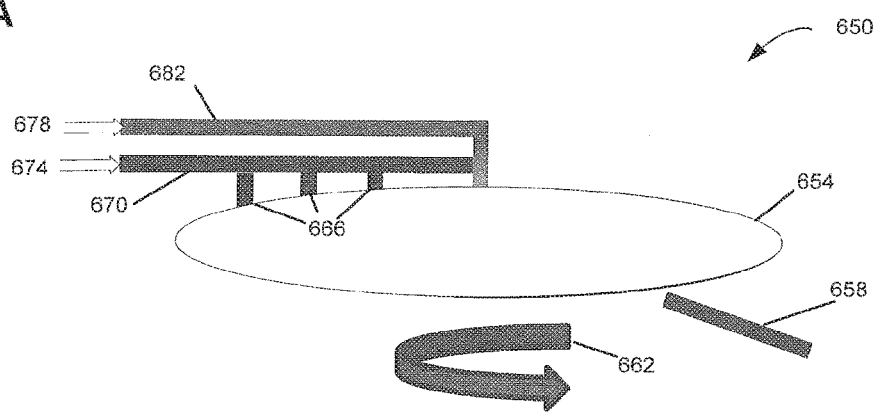
FIG. 6B depicts an exemplary schematic representation of a single substrate etch treatment system according to an embodiment of the present invention.

FIG. 6B depicts an exemplary schematic representation of a single substrate etch treatment system 650 according to an embodiment of the present invention. A single substrate 654 is mounted on stage 662 configured to keep the substrate 654 stationary or to rotate the substrate 654 while a treatment liquid 678 is dispensed from supply line 682 and the steam water vapor mixture 674 is dispensed from supply delivery line 670. The steam water vapor mixture 674 is delivered through supply delivery line 670 across the substrate 654 via nozzles 666 arranged so as to effect uniform processing across the substrate 654. Multiple etch treatment system setups similar to single substrate treatment system 650 can be configured in several arrangements such as stacked, orthogonal, or circular arrangements and the like that can be serviced by a common substrate transfer system. Steam may be delivered onto the backside of the substrate 654 via steam delivery line 658 in order to preheat or maintain uniform temperature across the substrate 654.

Figure 7A:
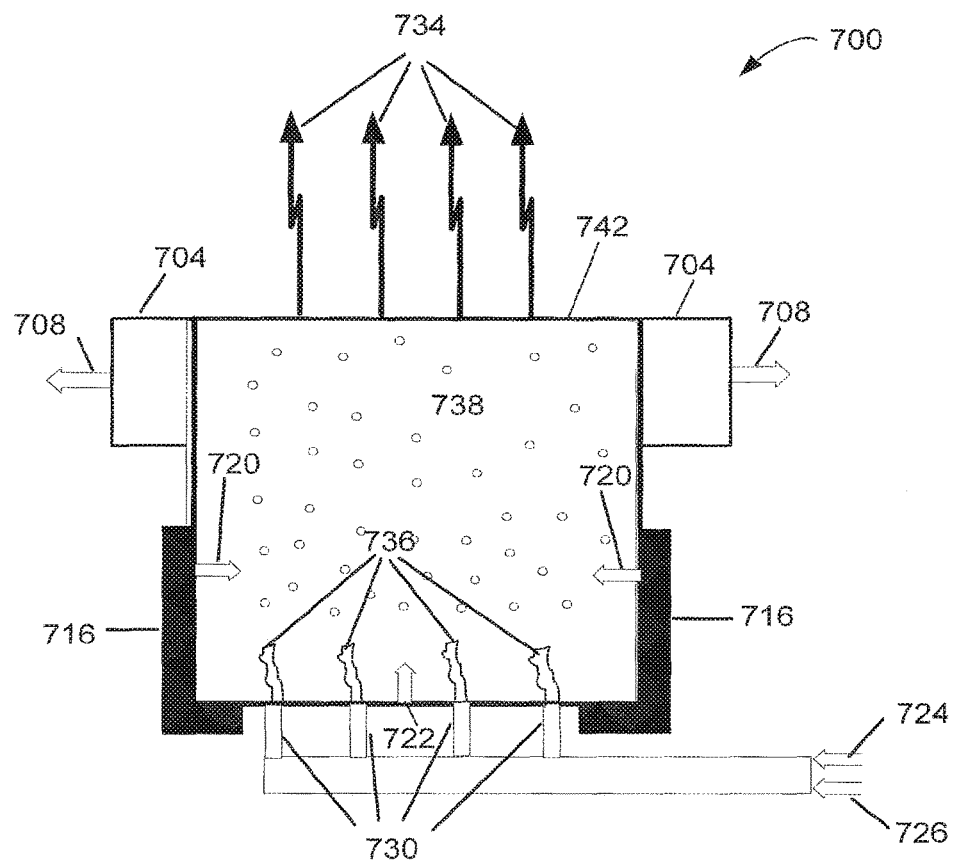
FIG. 7A is an exemplary schematic representation of batch etch treatment system using nozzles to dispense the steam according to an embodiment of the present invention.

FIG. 7A is an exemplary schematic representation of a batch etch treatment system 700 using nozzles 730 to dispense the steam water vapor mixture according to an embodiment of the present invention. A treatment liquid 738 can be heated by heaters 716 positioned in a front and back of an etch processing chamber 742. The heaters 716 may be external or inline, providing a heat flux in 720 to the treatment liquid 738 in the etch processing chamber 742. Furthermore, an additional heat flux in 722 is provided by the injection of steam water vapor mixture 736 in the treatment liquid 738, delivered via supply delivery line 726. The heat flux out comprises conduction 708 and evaporation of the water 734. If the heat flux in is greater than the heat flux out 708, 734 due to evaporation and conduction, a temperature of the treatment liquid 738 will increase until boiling occurs. The boiling point is fixed by the treatment liquid 738 concentration and atmospheric pressure. During boiling, an increase in heat boils the water away faster.

To maintain a constant boiling temperature for the treatment liquid 738, the process chamber controller (not shown) must regulate the heaters 716 and the injection of steam water vapor mixture through nozzles 730 at the same time. If the supply of steam water vapor mixture is greater than the water loss due to evaporation, the temperature of the treatment liquid 738 decreases, diluting the treatment liquid 738 and lowering the boiling point. Conversely, if the water supply in is less than the water loss due to evaporation, the temperature of the treatment liquid 738 increases, concentrating the acid and raising the boiling point. Placing the nozzles 730 at a bottom of the etch processing chamber 742 provides mixing actions so as to create a uniform temperature profile in the treatment liquid 738. The treatment liquid 738 can be introduced via the second supply delivery line 724 to the nozzles 730. Excess treatment liquid 738 goes to a spill tank 704. The batch etch treatment system 700 provides a way to increase the etch rate of a masking layer, for example, silicon nitride by raising a temperature of the treatment liquid 738. The target etch selectivity, the ratio of silicon nitride etching over the silicon oxide or silicon, is also maintained by controlling the molarity of the treatment liquid 738, for example, by adding more or less steam water vapor mixture, and/or increasing or decreasing the temperature of the steam water vapor mixture distributed through the nozzles 730.

Figure 7B:
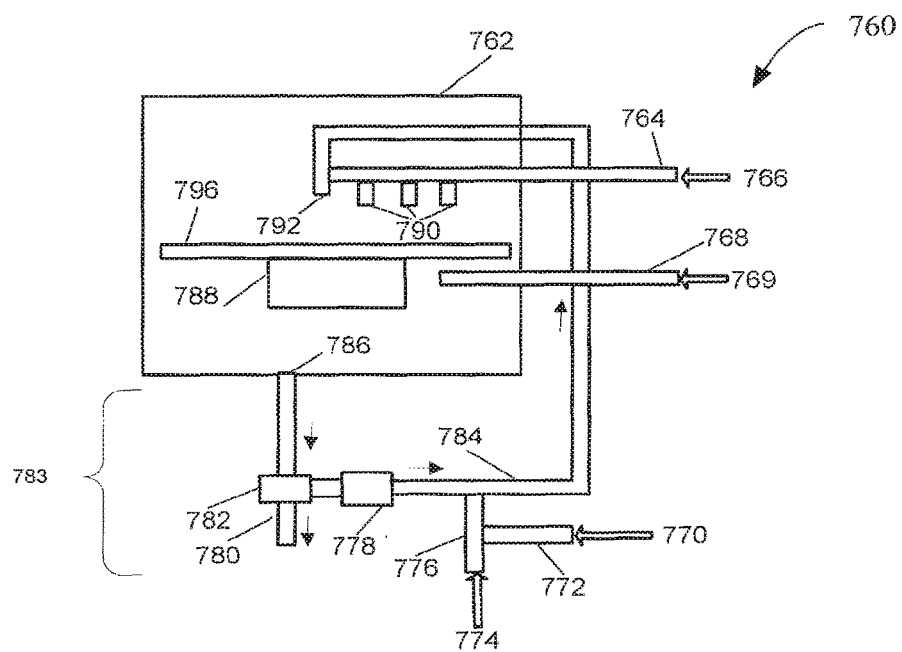
FIG. 7B depicts an exemplary schematic representation of a single substrate etch treatment system including a treatment liquid recycling system according to an embodiment of the present invention.

FIG. 7B depicts an exemplary schematic representation of a single substrate etch treatment system 760 including a treatment liquid recycling system 783 according to an embodiment of the present invention. Recycling the treatment liquid 774 reduces chemical usage and assists etch selectivity by keeping a high concentration of silica in the treatment liquid to keep the equilibrium of Reaction 2 to the left as will be discussed further below. Referring to the single substrate etch treatment system 760, a single substrate 796 is positioned on a stage 788 configured to make the substrate 796 stationary or rotating inside the etch processing chamber 762. A steam water vapor mixture 766 is delivered using supply line 764 and dispensed onto the substrate using nozzles 790 and 792. Steam 769 is dispensed using a steam input line 768 onto the back surface of the substrate 796 to maintain a uniform temperature for the substrate 796. The steam 769 may be the same as the steam water vapor mixture 766. The treatment liquid recycling system 783 comprises a drain line 786 coupled to the bottom of the etch processing chamber 762 and goes through a control valve 782 that disposes a portion of the treatment liquid 774 through disposal line 780 and recycles the balance of the treatment liquid 774 through recycle line 784 and back into the etch processing chamber via nozzle 792. An optional heater 778 may be positioned before or after the liquid treatment delivery line 776 to maintain a desired temperature of the recycled treatment liquid 774. New treatment liquid 774 is introduced onto the recycle line 784 using treatment liquid delivery line 776.

Referring to FIG. 7B, dissolved silica assists in maintaining the target silicon nitride etch rate by inhibiting Reaction 2. In one embodiment, dissolved silica ($Si(OH)_4$) 770 is injected onto the treatment liquid 774 using a silica injection line 772 and using delivery line 776, the amount of silica sufficient to maintain the amount of dissolved silica at a certain target range, for example, 10 to 30 ppm dissolved silica. In one implementation, the dissolved silica can be 20 ppm. In another embodiment, a number of substrates 796 containing silicon nitride is processed in order to obtain a desired amount of dissolved silica in the recycled treatment liquid 774. One advantage of the present invention using a single substrate treatment system is tolerance for a higher concentration of silica in the treatment liquid. Prior art batch etch treatment systems using phosphoric acid typically showed an increase in defect rate as the concentration of silica went up. A single substrate treatment system is inherently advantageous due to lower defect rate than batch etch treatment systems for the same application, in addition to tolerance of the higher concentration of silica, which helps maintain a stable selectivity ratio of the masking layer to the silicon oxide.

Figure 8A:
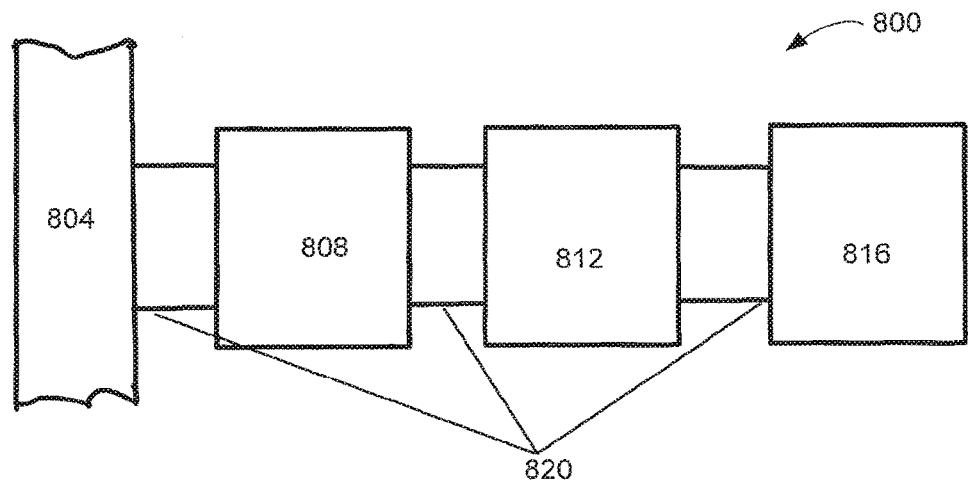
FIGS. 8A, 8B, and 8C are exemplary schematic representations of a transfer system for an etch treatment system in several embodiments of the present invention.
Figure 8B:
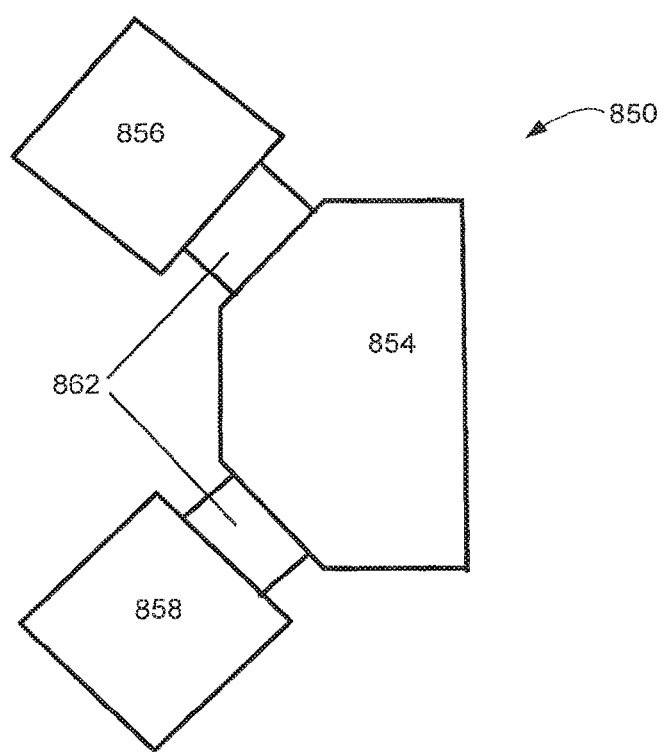
Figure 8C:
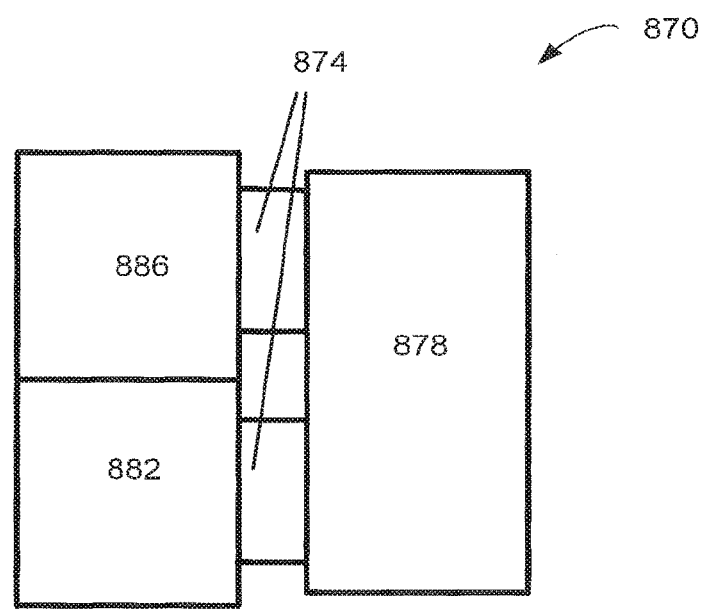

FIGS. 8A, 8B, and 8C are exemplary schematic representations of a transfer system for an etch treatment system in several embodiments of the present invention. According to one embodiment, FIG. 8A depicts a processing system 800 for performing a non-plasma cleaning process on a substrate or on substrates. The processing system 800 comprises a first treatment system 816, and a second treatment system 812 coupled to the first treatment system 816. For example, the first treatment system 816 can comprise a chemical treatment system (or chemical treatment component of a single process chamber), and the second treatment system 812 can comprise a thermal treatment system (or thermal treatment component system (or thermal treatment component of a single process chamber).

Also, as illustrated in FIG. 8A, a transfer system 808 can be coupled to the first treatment system 816 in order to transfer a substrate or substrates into and out of the first treatment system 816 and the second treatment system 812, and exchange substrates with a multi-element manufacturing system 804. The first and second treatment systems 816, 812, and the transfer system 808 can, for example, comprise a processing element within the multi-element manufacturing system 804. For example, the multi-element manufacturing system 804 can permit the transfer of a substrate or substrates to and from processing elements including such devices as etch treatment systems, deposition systems, coating systems, patterning systems, metrology systems, etc. In order to isolate the processes occurring in the first and second systems, an isolation assembly 820 can be utilized to couple each system. For instance, the isolation assembly 820 can comprise at least one of a thermal insulation assembly to provide thermal isolation, and a gate valve assembly to provide a vacuum isolation. Of course, treatment systems 816 and 812, and transfer system 808 can be placed in any sequence.

Alternately, in another embodiment, FIG. 8B presents a processing system 850 for performing a non-plasma cleaning process on a substrate. The processing system 850 comprises a first treatment system 856, and a second treatment system 858. For example, the first treatment system 856 can comprise a chemical treatment system, and the second treatment system 858 can comprise a thermal treatment system.

Also, as illustrated in FIG. 8B, a transfer system 854 can be coupled to the first treatment system 856 in order to transfer a substrate or substrates into and out of the first treatment system 856, and can be coupled to the second treatment system 858 in order to transfer a substrate or substrates into and out of the second treatment system 858. Additionally, transfer system 854 can exchange a substrate or substrates with one or more substrate cassettes (not shown). Although only two process systems are illustrated in FIG. 8B, other process systems can access transfer system 854 including such devices as etch treatment systems, deposition systems, coating systems, patterning systems, metrology systems, etc. In order to isolate the processes occurring in the first and second systems, an isolation assembly 862 can be utilized to couple each system. For instance, the isolation assembly 862 can comprise at least one of a thermal insulation assembly to provide thermal isolation, and a gate valve assembly to provide vacuum isolation. Additionally, for example, the transfer system 854 can serve as part of the isolation assembly 862.

Alternately, in another embodiment, FIG. 8C presents a processing system 870 for performing a non-plasma cleaning process on a substrate or on substrates. The processing system 870 comprises a first treatment system 886, and a second treatment system 882, wherein the first treatment system 886 is stacked atop the second treatment system 882 in a vertical direction as shown. For example, the first treatment system 886 can comprise a chemical treatment system, and the second treatment system 882 can comprise a thermal treatment system.

Also, as illustrated in FIG. 8C, a transfer system 878 can be coupled to the first treatment system 886 in order to transfer a substrate or substrates into and out of the first treatment system 886, and can be coupled to the second treatment system 882 in order to transfer a substrate or substrates into and out of the second treatment system 882. Additionally, transfer system 878 can exchange a substrate or substrates with one or more substrate cassettes (not shown). Although only two process systems are illustrated in FIG. 8C, other process systems can access transfer system 878 including such devices as etch treatment systems, deposition systems, coating systems, patterning systems, metrology systems, etc. In order to isolate the processes occurring in the first and second systems, an isolation assembly 874 can be utilized to couple each system. For instance, the isolation assembly 874 can comprise at least one of a thermal insulation assembly to provide thermal isolation, and a gate valve assembly to provide vacuum isolation. Additionally, for example, the transfer system 878 can serve as part of the isolation assembly 874. As illustrated above, the chemical treatment system and the thermal treatment system may comprise separate process chambers coupled to one another. Alternatively, the chemical treatment system and the thermal treatment system may be a component of a single process chamber.

Figure 9:
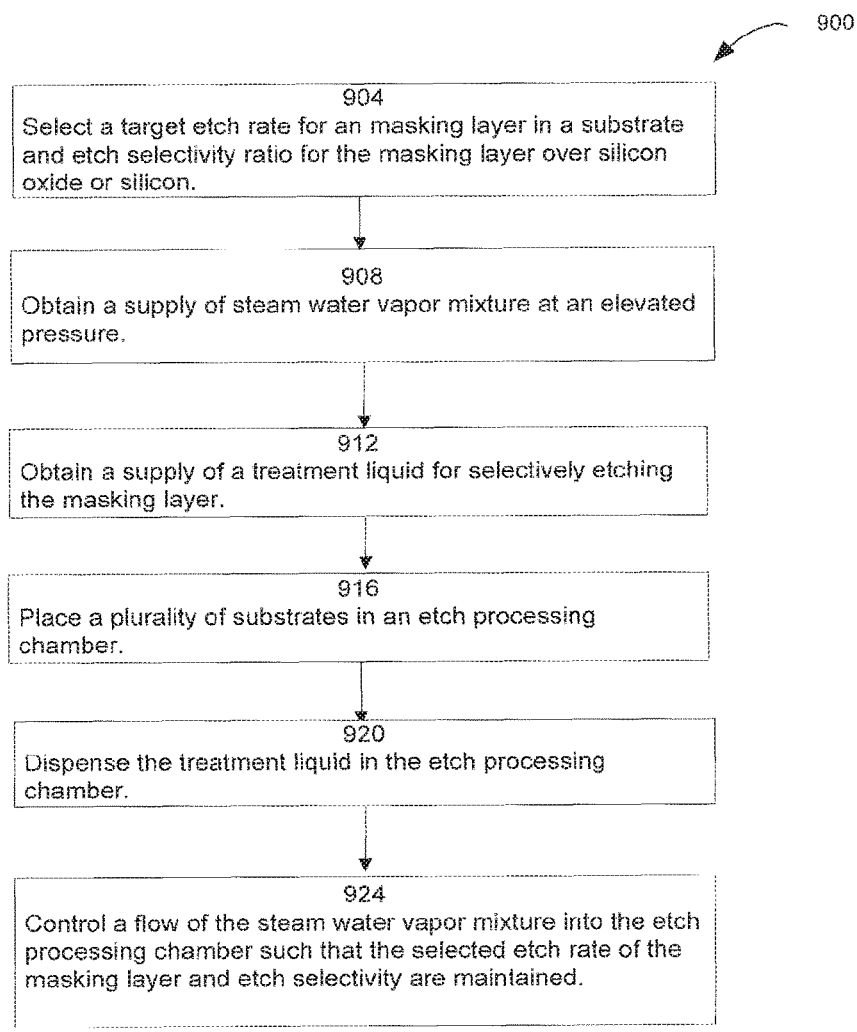
FIG. 9 is an exemplary flowchart of a method for increasing etch rate and etch selectivity for a masking layer of a substrate for a batch etch treatment system using a treatment liquid and steam in an embodiment of the present invention.

FIG. 9 is an exemplary flowchart for a method 900 for increasing etch rate and etch selectivity for a masking layer of a substrate for a batch etch treatment system using a treatment liquid and steam water vapor mixture in an embodiment. In step 904, a target etch rate and target etch selectivity ratio for the masking layer over silicon oxide or silicon are selected. The masking layer can be silicon nitride, gallium nitride or aluminum nitride and the like. In step 908, a supply of steam water vapor mixture at an elevated pressure is obtained. The steam water vapor mixture may be provided by an inline steam generator or from a general purpose steam source in the fabrication cluster. In step 912, a supply of a treatment liquid for selectively etching a masking layer is obtained. The treatment liquid can include phosphoric acid, hydrofluoric acid, or hydrofluoric acid/ethylene glycol and the like. In step 916, a plurality of substrates is placed in the etch processing chamber. In step 920, the treatment liquid is dispensed in the etch processing chamber, wherein dispensing can be performed using a supply delivery line or using a nozzle. In step 924, a flow of steam water vapor mixture is injected into the etch processing chamber, wherein the flow rate of the steam water vapor mixture is controlled to achieve the target etch rate for the masking layer and target etch selectivity of the masking layer over the silicon oxide or silicon. The flow rate of the steam water vapor mixture can be correlated to data based on treatment liquid concentration, temperature of the aqueous solution, and steam pressure as shown in FIGS. 4A and 4B. As mentioned in the description of FIG. 4B, a flow rate and pressure of the steam water vapor mixture can be used as variables for controlling a temperature of the treatment liquid, which affects the boiling point temperature of the treatment liquid and further resulting in a concentration of phosphoric acid in the treatment liquid. The equilibrium phosphoric acid concentration and temperature affect the etch rate and etch selectivity.

Figure 10:
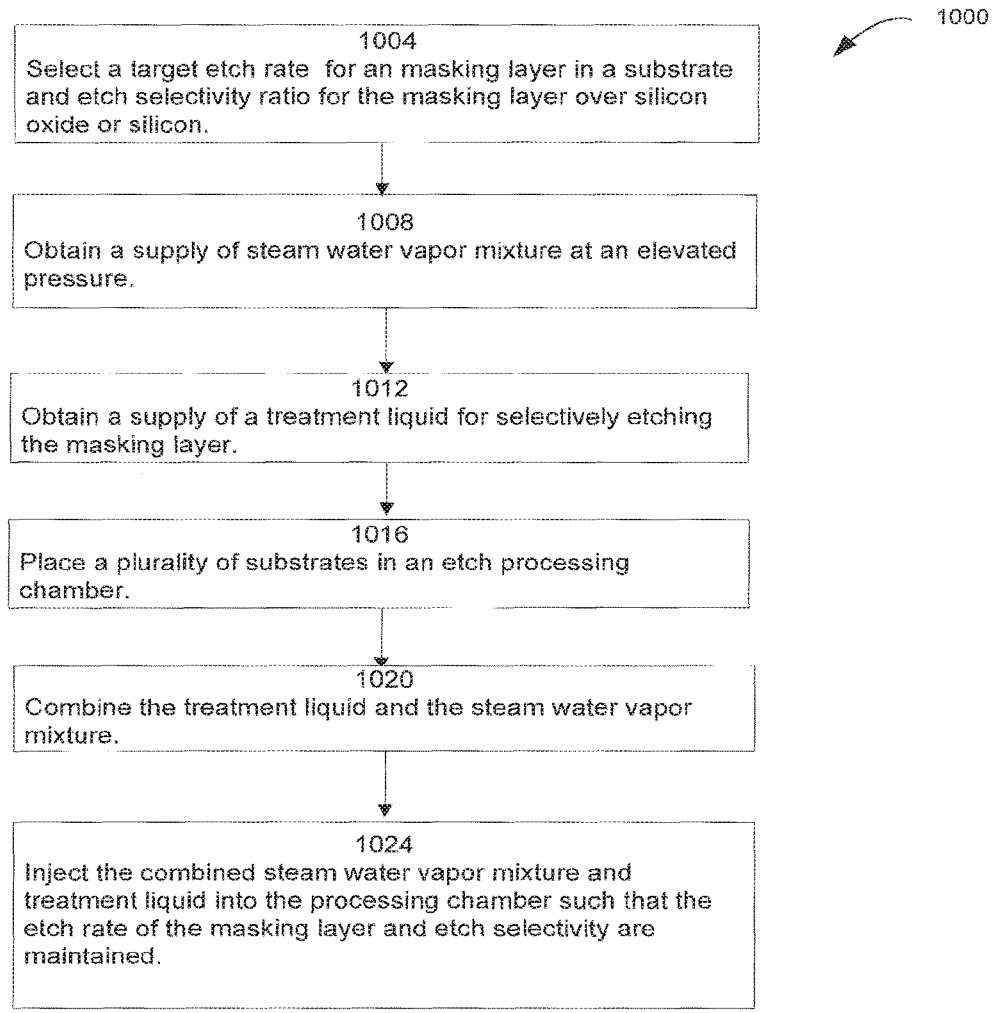
FIG. 10 is an exemplary flowchart of a method for increasing etch rate and selectivity for a masking layer of a substrate for a batch etch treatment system using a combined treatment liquid and steam in an embodiment of the present invention.

FIG. 10 is an exemplary flowchart for a method 1000 for increasing etch rate and etch selectivity for a masking layer of a substrate in a batch etch treatment system using a combined treatment liquid and steam water vapor mixture. In step 1004, a target etch rate and target etch selectivity for the masking layer over silicon oxide or silicon are selected. The masking layer can be silicon nitride, gallium nitride, or aluminum nitride and the like. In step 1008, a supply of steam water vapor mixture at an elevated pressure is obtained. The supply may be provided by an inline steam generator or from a general purpose steam source in the fabrication cluster. In step 1012, a supply of a treatment liquid for selectively etching a masking layer is obtained. The treatment liquid can include phosphoric acid, hydrofluoric acid, or hydrofluoric acid/ethylene glycol and the like. In step 1016, a plurality of substrates is placed in the etch processing chamber. In step 1020, the treatment liquid is combined with the steam water vapor mixture in a mixing tank or in a supply delivery line. Sufficient pressure must be maintained to avoid boiling in the supply delivery line. The treatment liquid will commence rapid boiling upon entering the etch processing chamber at ambient pressure.

Referring to FIG. 10, in step 1024, a flow of the combined steam water vapor mixture and treatment liquid is injected into the etch processing chamber, wherein the flow rate of the steam water vapor mixture is controlled to achieve the target etch rate for the masking layer and target etch selectivity of the masking layer over the silicon oxide or silicon. As mentioned above, the flow rate of the steam water vapor mixture can be correlated to data based on treatment liquid concentration, temperature of the aqueous solution, and steam pressure as shown in FIGS. 4A and 4B. As mentioned in the description of FIG. 4B, a flow rate and pressure of the steam water vapor mixture can be used as variables for controlling a temperature of the treatment liquid, which affects the boiling point temperature of the treatment liquid and further resulting in a concentration of phosphoric acid in the treatment liquid. The equilibrium phosphoric acid concentration and temperature affect the etch rate and etch selectivity.

The correlation can be used to determine the flow rate needed to meet the target etch rate and target etch selectivity. In one embodiment, the steam water vapor mixture and treatment liquid are combined in a supply delivery line before entering the etch processing chamber. In another embodiment, the steam water vapor mixture and treatment liquid are combined immediately before exiting the supply delivery line in the etch processing chamber.

Figure 11:
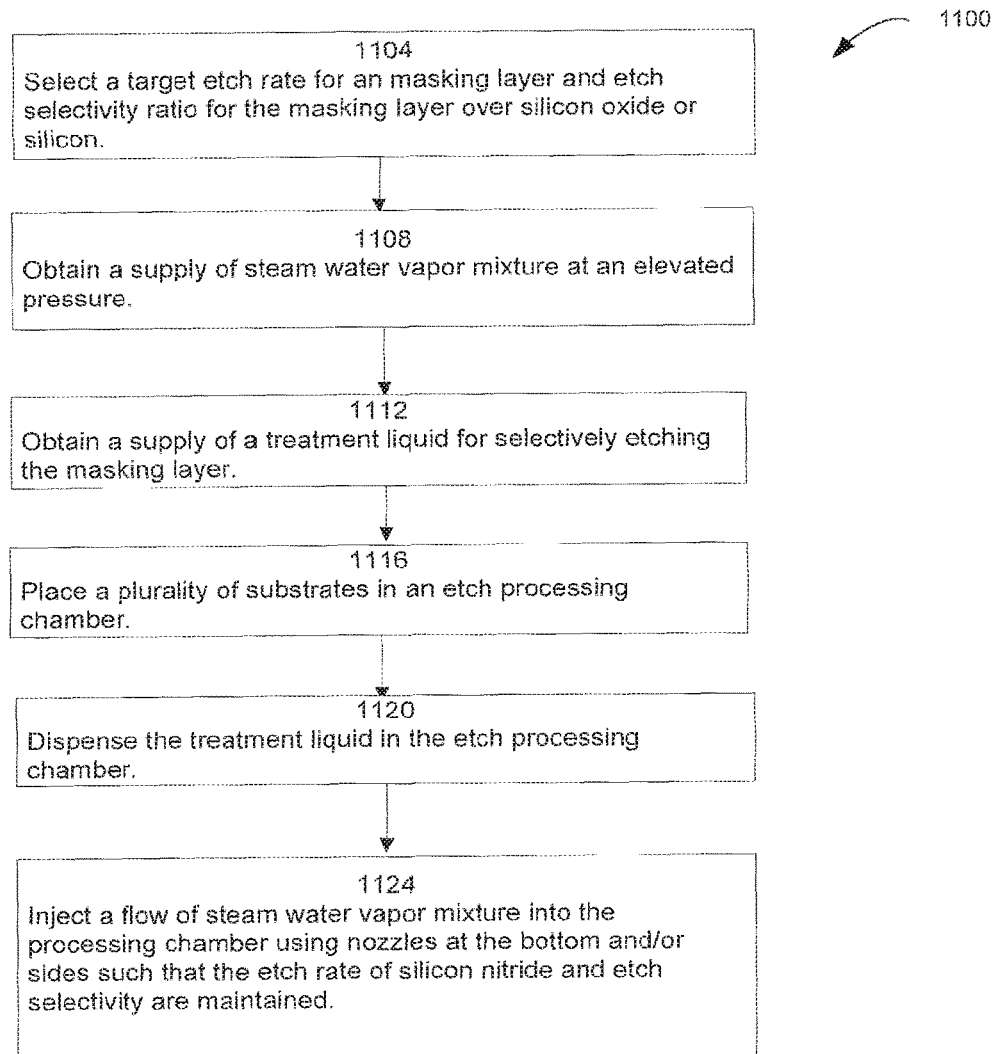
FIG. 11 is an exemplary flowchart of a method for increasing etch rate and selectivity for a masking layer of a substrate for a batch etch treatment system using injection nozzles in an embodiment of the present invention.

FIG. 11 is an exemplary flowchart for a method 1100 for increasing etch rate and etch selectivity for a masking layer of a substrate in a batch etch treatment system using a plurality of nozzles positioned at a bottom and sides of the etch processing chamber. In step 1104, a target etch rate and target etch selectivity for the masking layer over silicon oxide or silicon are selected. The masking layer can be silicon nitride, gallium nitride, or aluminum nitride and the like. In step 1108, a supply of steam water vapor mixture at an elevated pressure is obtained. The supply may be provided by an inline steam generator or from a general purpose steam source in the fabrication cluster. In step 1112, a supply of a treatment liquid for selectively etching a masking layer is obtained. The treatment liquid can include phosphoric acid, hydrofluoric acid, or hydrofluoric acid/ethylene glycol and the like. In step 1116, a plurality of substrates is placed in the etch processing chamber. In step 1120, the treatment liquid is dispensed in the etch processing chamber.

In step 1124, a flow of the combined steam water vapor mixture and treatment liquid is injected into the etch processing chamber using the plurality of nozzles, wherein the flow rate of the steam water vapor mixture is controlled to achieve the target etch rate for the masking layer and target etch selectivity of the masking layer over the silicon oxide or silicon. The plurality of nozzles can be positioned in the bottom and/or on the sides of the etch processing chamber. Arrangements of the plurality of nozzles can be varied to ensure temperature uniformity and consequently etching uniformity. As mentioned above, the flow rate of the steam water vapor mixture can be correlated to data based on treatment liquid concentration, temperature of the aqueous solution, and steam pressure as shown in FIGS. 4A and 4B. As mentioned in the description of FIG. 4B, a flow rate and pressure of the steam water vapor mixture can be used as variables for controlling a temperature of the treatment liquid, which affects the boiling point temperature of the treatment liquid and further resulting in a concentration of phosphoric acid in the treatment liquid. The equilibrium phosphoric acid concentration and temperature affect the etch rate and etch selectivity.

Figure 12:
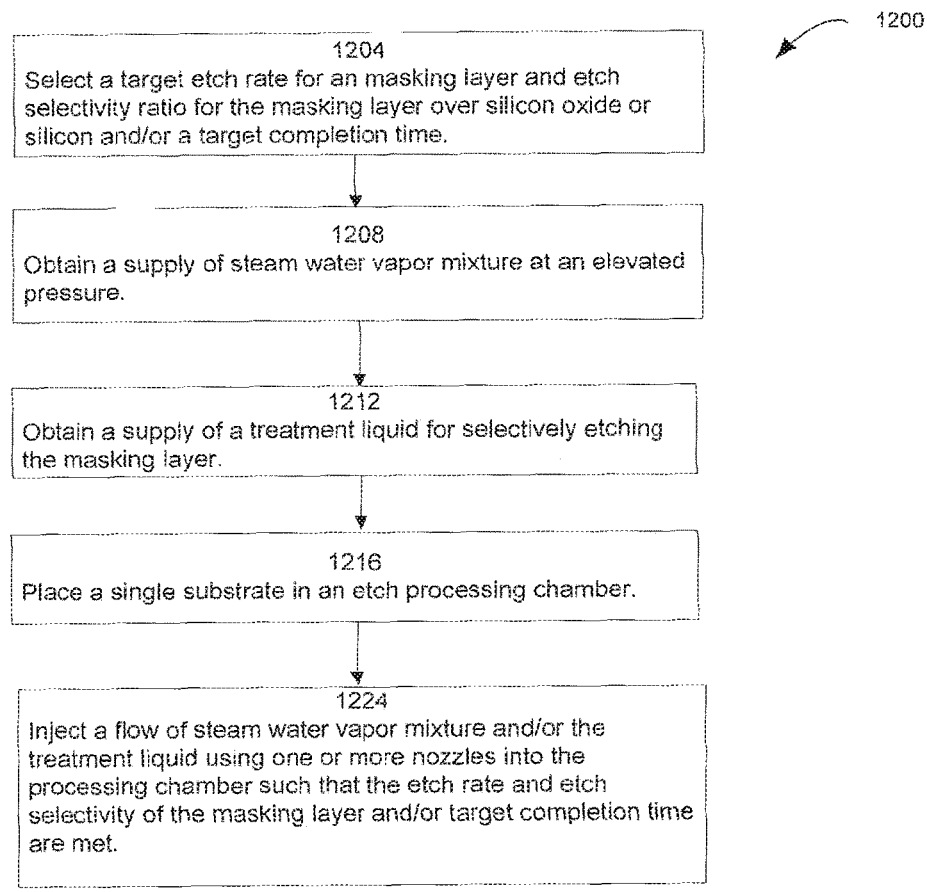
FIG. 12 is an exemplary flowchart for a method for increasing etch rate and selectivity for a masking layer of a substrate in a single substrate etch treatment system in an embodiment of the present invention.

FIG. 12 is an exemplary flowchart for a method for increasing etch rate and etch selectivity for a layer of a substrate in a single substrate etch treatment system. In step 1204, a target etch rate and target etch selectivity for the masking layer over silicon oxide or silicon, and/or target completion time are selected. The masking layer can be silicon nitride, gallium nitride, or aluminum nitride and the like. In step 1208, a supply of steam water vapor mixture at an elevated pressure is obtained. The supply may be provided by an inline steam generator or from a general purpose steam source in the fabrication cluster. In step 1212, a supply of a treatment liquid for selectively etching a masking layer is obtained. The treatment liquid can include phosphoric acid, hydrofluoric acid, or hydrofluoric acid/ethylene glycol and the like. In step 1216, a single substrate is placed in the etch processing chamber. In one embodiment, two or more etch processing chambers can be configured such that these chambers can be supplied with the treatment liquid, supplied with steam water vapor mixture, and loaded with and unloaded of substrates. In step 1220, the treatment liquid is dispensed in the etch processing chamber, wherein dispensing can be performed using a supply delivery line or a nozzle. In step 1224, a flow of steam water vapor mixture and/or treatment liquid is injected into the etch processing chamber using one or more nozzles while the substrate is spinning. Alternatively, the substrate can be stationary while the nozzles are made to rotate.

Referring to FIG. 12, in one embodiment, the treatment liquid and steam water vapor mixture are combined in the supply delivery line prior to entry into the etch processing chamber or after entry into the etch processing chamber but prior to exit out of the nozzle. Sufficient pressure must be maintained in order to avoid boiling in the supply delivery line. The treatment liquid will then commence rapid boiling upon entering the processing chamber at ambient pressure. In another embodiment, multiple nozzles can be used above the substrate. The first nozzle introduces the heated phosphoric acid, the second or more nozzle(s) introduce jets of high temperature steam to preheat the substrate surface prior to introduction of the phosphoric acid to help maintain uniform temperature across the substrate and ensure etch uniformity. In another embodiment, the nozzle position and number of nozzles can be positioned to maximize the efficiency of heat delivery and treatment liquid to the substrate. In still another embodiment, steam water vapor mixture can also be injected onto the backside of the substrate to maintain temperature uniformity.

Figure 13:
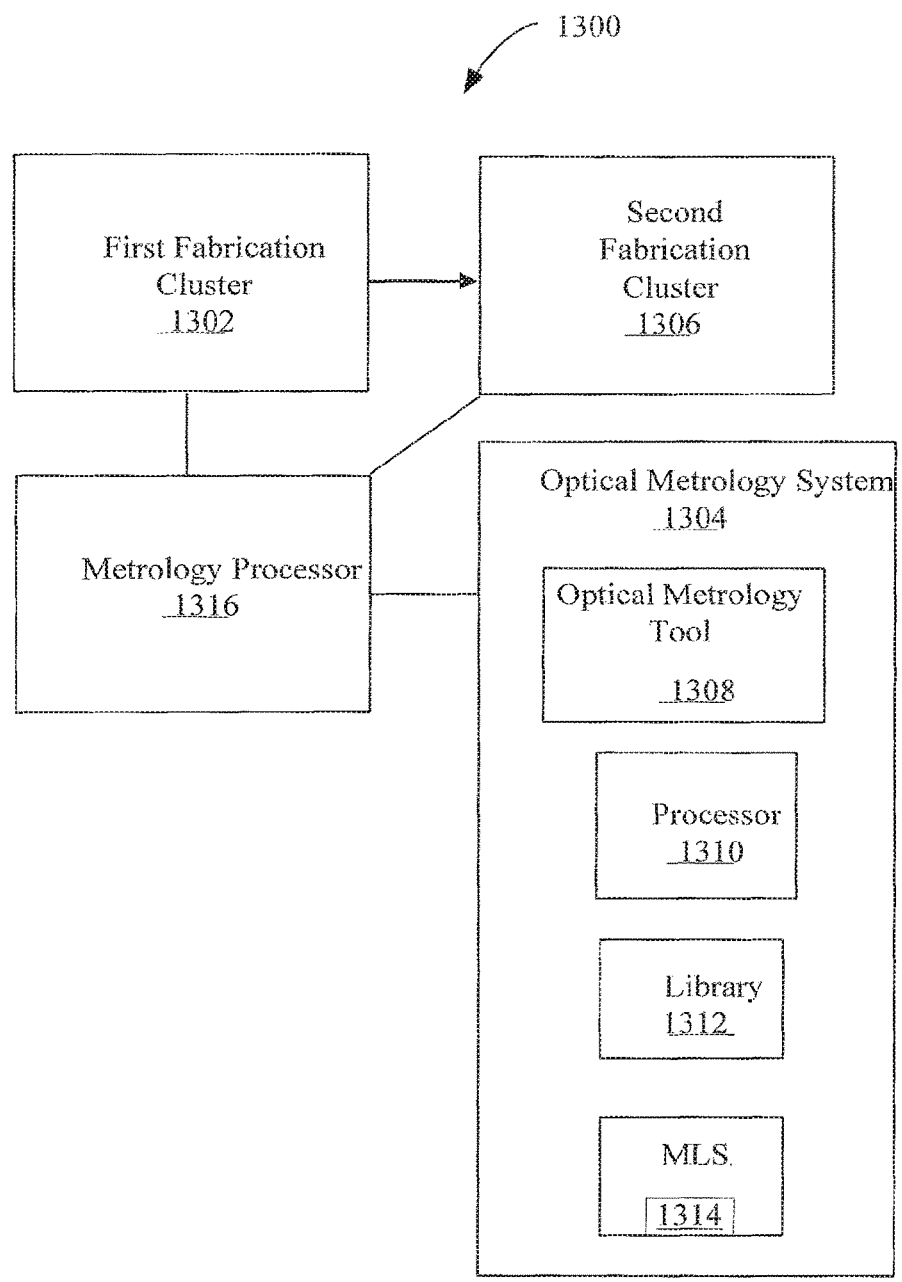
FIG. 13 is an exemplary schematic representation of a process control system for controlling a fabrication cluster using an etch treatment system configured to increase etch rate and etch selectivity in an embodiment of the present invention.

FIG. 13 is an exemplary block diagram of a system 1300 for determining and utilizing profile parameters of a structure on a substrate after etch processing where the profile parameter values are used for automated process and equipment control. System 1300 includes a first fabrication cluster 1302 and optical metrology system 1304. System 1300 also includes a second fabrication cluster 1306. For details of an optical metrology system used to determine profile parameters of a structure on a substrate, refer to U.S. Pat. No. 6,943,900, titled GENERATION OF A LIBRARY OF PERIODIC GRATING DIFFRACTION SIGNALS, issued on Sep. 13, 2005, which is incorporated herein by reference in its entirety. Although the second fabrication cluster 1306 is depicted in FIG. 13 as being subsequent to first fabrication cluster 1302, it should be recognized that second fabrication cluster 1306 can be located prior to first fabrication cluster 1302 in system 1300, for example, in the manufacturing process flow.

A photolithographic process, such as exposing and/or developing a photoresist layer applied to a substrate, can be performed using first fabrication cluster 1302. In one exemplary embodiment, optical metrology system 1304 includes an optical metrology tool 1308 and processor 1310. Optical metrology tool 1308 is configured to measure a diffraction signal off the sample structure. Processor 1310 is configured to use the measured diffraction signal measured by the optical metrology tool and adjust using a signal adjuster, generating an adjusted metrology output signal. Furthermore, processor 1310 is configured to compare the adjusted metrology output signal to the simulated diffraction signal. As mentioned above, the simulated diffraction is determined using an optical metrology tool model using ray tracing, a set of profile parameters of the structure and numerical analysis based on the Maxwell equations of electromagnetic diffraction. In one exemplary embodiment, optical metrology system 1304 can also include a library 1312 with a plurality of simulated diffraction signals and a plurality of values of one or more profile parameters associated with the plurality of simulated diffraction signals. As described above, the library can be generated in advance; metrology processor 1310 can compare an adjusted metrology output signal to the plurality of simulated diffraction signals in the library. When a matching simulated diffraction signal is found, the one or more values of the profile parameters associated with the matching simulated diffraction signal in the library is assumed to be the one or more values of the profile parameters used in the substrate application to fabricate the sample structure.

System 1300 also includes a metrology processor 1316. In one exemplary embodiment, processor 1310 can transmit the one or more values of the one or more profile parameters to metrology processor 1316. Metrology processor 1316 can then adjust one or more process parameters or equipment settings of the first fabrication cluster 1302 based on the one or more values of the one or more profile parameters determined using optical metrology system 1304. Metrology processor 1316 can also adjust one or more process parameters or equipment settings of the second fabrication cluster 1306 based on the one or more values of the one or more profile parameters determined using optical metrology system 1304. As noted above, second fabrication cluster 1306 can process the substrate before or after fabrication cluster 1302. In another exemplary embodiment, processor 1310 is configured to train machine learning system 1314 using the set of measured diffraction signals as inputs to machine learning system 1314 and profile parameters as the expected outputs of machine learning system 1314.

Figure 14:
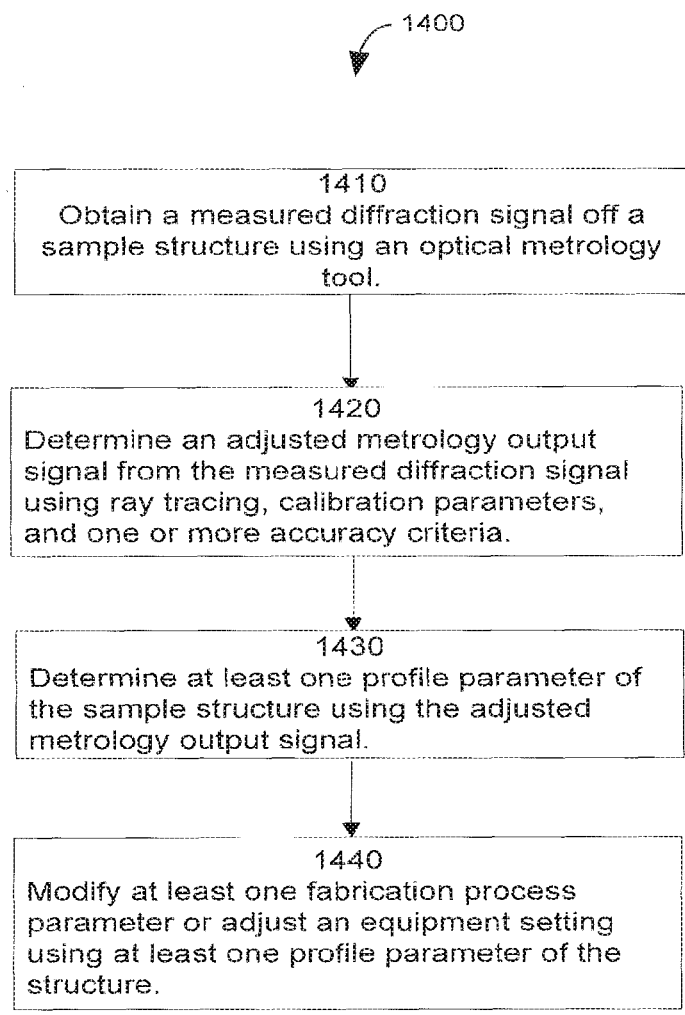
FIG. 14 is an exemplary flowchart of a method for controlling a fabrication cluster using an etch treatment system configured to increase etch rate and etch selectivity in an embodiment of the present invention.

FIG. 14 is an exemplary flowchart of a method for controlling a fabrication cluster using an etch treatment system configured to increase etch rate and etch selectivity. Using the system described in FIG. 13, after etch processing using the systems and methods described in relation to FIGS. 3 to 12, the structure in the substrate can be measured using the method as depicted with the exemplary block diagram 1400 of a system for determining and utilizing profile parameters for automated process and equipment control. In step 1410, a measured diffraction signal off a sample structure is obtained using an optical metrology tool. In step 1420, a metrology output signal is determined from the measured diffraction signal using ray tracing methodology, calibration parameters of the optical metrology device, and one or more accuracy criteria or other scatterometry methodologies such as regression, library matching or machine learning systems. In step 1430, at least one profile parameter of the sample structure is determined using the metrology output signal. In step 1440, at least one fabrication process parameter or an equipment setting is modified using at least one profile parameter of the structure.

Referring to FIGS. 6A and 6B, a controller (not shown) can be used to control the flow rates of the treatment liquid and steam water vapor mixture, pressure of the treatment liquid, sequencing of the use of the nozzles in the batch or single substrate etch application. A program stored in the memory of the controller can be utilized to activate the inputs to the aforementioned components of the etch treatment systems 600, 650 (FIGS. 6A and 6B) according to a process recipe in order to perform the method of increasing the etch rate and etch selectivity of the masking layer compared to silicon or silicon oxide. One example of controller 1090 is a DELL PRECISION WORKSTATION 610™, available from Dell Corporation, Austin, Tex. A controller can be locally located relative to the etch treatment systems 600, 650, or it can be remotely located relative to the etch treatment systems 600, 650, via an internet or intranet. Thus, the controller can exchange data with the etch treatment systems 600, 650, using at least one of a direct connection, an intranet, or the internet. The controller can be coupled to an intranet at a customer site (i.e., a device maker, etc.), or coupled to an intranet at a vendor site (i.e., an equipment manufacturer). Furthermore, another computer (i.e., controller, server, etc.) can access the controller of the etch treatment systems 600, 650 to exchange data via at least one of a direct connection, an intranet, or the internet.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A method of increasing etch rate and etch selectivity of a masking layer in an etch processing chamber configured for single substrate processing, the method comprising:
    placing a substrate into the etch processing chamber, the substrate containing the masking layer and a layer of silicon or silicon oxide;
    obtaining a supply of steam water vapor mixture at elevated pressure;
    obtaining a supply of treatment liquid for selectively etching the masking layer over the layer of silicon or silicon oxide at a selectivity ratio;
    combining the treatment liquid and the steam water vapor mixture; and
    injecting the combined treatment liquid and steam water vapor mixture into the etch processing chamber;
    wherein a flow of the combined treatment liquid and steam water vapor mixture is controlled to achieve a target etch rate and a target etch selectivity ratio of the masking layer to the layer of silicon or silicon oxide, and a target completion time of 3 minutes or less, and
    wherein the masking layer comprises silicon nitride and the treatment liquid comprises an aqueous phosphoric acid solution with dissolved silica.

2. The method of claim 1, wherein the target etch selectivity ratio is in the range from 10:1 to 1000:1.

3. The method of claim 1, wherein a temperature of the aqueous phosphoric acid solution is in the range of 160 to 220 degrees Centigrade.

4. The method of claim 1; wherein:
    the steam water vapor mixture at elevated pressure and the treatment liquid are combined at high pressure prior to entering the etch processing chamber.

5. The method of claim 1, wherein:
    flow rates of the steam water vapor mixture and treatment liquid are controlled to maintain the target etch selectivity ratio of silicon nitride to silicon or silicon oxide.

6. The method of claim 1, wherein:
    the injecting the combined treatment liquid and the steam water vapor mixture uses nozzles; and
    the steam water vapor mixture is introduced at a controlled rate to maintain the target etch selectivity ratio of silicon nitride to silicon or silicon oxide.

7. A method of increasing etch rate and etch selectivity of a masking layer in an etch processing chamber configured for single substrate processing, the method comprising:
    placing a substrate into the etch processing chamber, the substrate containing the masking layer and a layer of silicon or silicon oxide;
    obtaining a supply of steam water vapor mixture at elevated pressure;

obtaining a supply of treatment liquid for selectively etching the masking layer over the layer of silicon or silicon oxide at a selectivity ratio;

combining the treatment liquid and the steam water vapor mixture; and injecting the combined treatment liquid and steam water vapor mixture into the etch processing chamber;

wherein a flow of the combined treatment liquid and steam water vapor mixture is controlled to achieve a target etch rate and a target etch selectivity ratio of the masking layer to the layer of silicon or silicon oxide, and a target completion time of 3 minutes or less, and wherein the supply of steam water vapor mixture at elevated pressure is obtained from a boiling apparatus coupled to the etch processing chamber, and the elevated pressure is 0.25 to 2.0 MPa.

8. The method of claim 7, wherein:

the treatment liquid includes one of phosphoric acid; hydrofluoric acid; or hydrofluoric acid/ethylene glycol and wherein the masking layer is silicon nitride.

9. A method of increasing etch rate and etch selectivity of a masking layer in an etch processing chamber configured for single substrate processing, the method comprising:

placing a substrate into the etch processing chamber, the substrate containing the masking layer and a layer of silicon or silicon oxide;

obtaining a supply of steam water vapor mixture at elevated pressure;

obtaining a supply of treatment liquid for selectively etching the masking layer over the layer of silicon or silicon oxide at a selectivity ratio;

combining the treatment liquid and the steam water vapor mixture; and injecting the combined treatment liquid and steam water vapor mixture into the etch processing chamber;

wherein a flow of the combined treatment liquid and steam water vapor mixture is controlled to achieve a target etch rate and a target etch selectivity ratio of the masking layer to the layer of silicon or silicon oxide, and a target completion time of 3 minutes or less, and the method further comprising:

introducing the steam water vapor mixture into the etch processing chamber to preheat the substrate prior to injecting the combined treatment liquid and steam water vapor mixture into the etch processing chamber, or introducing the steam water vapor mixture onto the backside of the substrate to maintain temperature uniformity, or both.

10. A method of increasing etch rate and etch selectivity of a masking layer in an etch processing chamber configured for single substrate processing, the method comprising:

placing a substrate into the etch processing chamber maintained at ambient pressure, the substrate containing the masking layer and a layer of silicon or silicon oxide;

obtaining a supply of steam water vapor mixture into a steam delivery line;

obtaining a supply of treatment liquid into a treatment liquid delivery line, the treatment liquid for selectively etching the masking layer over the layer of silicon or silicon oxide at a selectivity ratio;

injecting the steam water vapor mixture from the steam delivery line into the etch processing chamber via a first nozzle to preheat the substrate;

combining the treatment liquid and the steam water vapor mixture at a junction between the steam delivery line and the treatment liquid delivery line upstream of the etch processing chamber to form a heated mixture of the treatment liquid and steam water vapor mixture;

injecting the heated mixture of the treatment liquid and steam water vapor mixture into the etch processing chamber via a second nozzle; and controlling the flow rates and pressures in the treatment liquid delivery line and the steam delivery line to maintain the pressures above the ambient pressure in the etch processing chamber to prevent boiling of the heated mixture of the treatment liquid and steam water vapor mixture between the junction and the second nozzle and to permit rapid boiling in the etch processing chamber upon exit from the second nozzle, and controlling the flow rates, the ambient pressure in the etch processing chamber, and the sequencing of the first and second nozzles to achieve a target etch rate and a target etch selectivity ratio of the masking layer to the layer of silicon or silicon oxide.

11. The method of claim 10, wherein the masking layer comprises silicon nitride and the treatment liquid comprises an aqueous phosphoric acid solution with dissolved silica.

12. The method of claim 11, further comprising:

recycling a portion of the treatment liquid from the etch processing chamber back to the treatment liquid delivery line.

13. The method of claim 12, further comprising maintaining a target dissolved silica concentration in the treatment liquid in the range of 10 to 30 ppm.

14. The method of claim 13 wherein maintaining the target dissolved silica concentration is achieved by introducing dissolved silica into the treatment liquid prior to the junction or by sequentially processing in the etch processing chamber a number of substrates each containing at least one layer of silicon nitride, the number of substrates processed being determined by the target dissolved silica concentration.

15. The method of claim 10 further comprising:

introducing the steam water vapor mixture onto the backside of the substrate via a third nozzle to maintain temperature uniformity.

16. The method of claim 10, wherein the target etch selectivity ratio is in the range from 10:1 to 1000:1.

17. The method of claim 10, wherein the target etch rate is higher than 120 Angstroms per minute, and a target completion time for etching the masking layer is 3 minutes or less.

18. The method of claim 10, wherein the pressure in the treatment liquid delivery line and the steam delivery line to prevent boiling is 0.25 to 2.0 MPa.

19. The method of claim 10, wherein the masking layer comprises silicon nitride, the treatment liquid comprises an aqueous phosphoric acid solution with 10 to 30 ppm dissolved silica, the pressure in the treatment liquid delivery line and the steam delivery line to prevent boiling is 0.25 to 2.0 MPa, the target etch selectivity ratio is in the range from 10:1 to 1000:1, the target etch rate is higher than 120 Angstroms per minute, and a target completion time for etching the masking layer is 3 minutes or less.

20. The method of claim 9, wherein:

the treatment liquid includes one of phosphoric acid; hydrofluoric acid; or hydrofluoric acid/ethylene glycol and wherein the masking layer is silicon nitride.

* * * * *